US008245389B2

(12) United States Patent
Hirano et al.

(10) Patent No.: US 8,245,389 B2
(45) Date of Patent: Aug. 21, 2012

(54) METHOD OF MANUFACTURING A SEMICONDUCTOR DEVICE

(75) Inventors: Makoto Hirano, Toyama (JP); Akihiro Yoshida, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 8 days.

(21) Appl. No.: 13/064,563

(22) Filed: Mar. 31, 2011

(65) Prior Publication Data
US 2011/0183446 A1 Jul. 28, 2011

Related U.S. Application Data (60) Continuation of application No. 12/081,200, filed on Apr. 11, 2008, now Pat. No. 7,975,376, which is a division of application No. 10/570,156, filed as application No. PCT/JP2004/013791 on Sep. 22, 2004, now abandoned.

(30) Foreign Application Priority Data

Sep. 25, 2003 (JP) ................................. 2003-333664

(51) Int. Cl.
H05K 3/36 (2006.01)
(52) U.S. Cl. ................ 29/830; 29/831; 29/832; 29/846; 29/847; 29/852
(58) Field of Classification Search .................. 29/830, 29/831, 832, 846, 847, 852; 414/804, 805, 414/217, 217.1, 937; 438/14, 745
See application file for complete search history.

(56) References Cited

U.S. PATENT DOCUMENTS

| 4,810,473 | A | | 3/1989 | Tamura et al. |
| 5,562,383 | A | * | 10/1996 | Iwai et al. .................. 414/217.1 |
| 5,565,034 | A | | 10/1996 | Nanbu et al. |
| 5,915,957 | A | * | 6/1999 | Tanigawa .......................... 432/5 |
| 5,922,126 | A | | 7/1999 | Furukawa et al. |
| 6,092,980 | A | | 7/2000 | Kumasaka et al. |
| 6,143,083 | A | | 11/2000 | Yonemitsu et al. |
| 6,221,201 | B1 | | 4/2001 | Tamura et al. |
| 6,270,619 | B1 | | 8/2001 | Suzuki et al. |
| 6,390,754 | B2 | | 5/2002 | Yamaga et al. |

(Continued)

FOREIGN PATENT DOCUMENTS

JP A-61-248839 11/1986

(Continued)

OTHER PUBLICATIONS

Dec. 7, 2011, Office Action issued in U.S. Appl. No. 12/659,409.

(Continued)

*Primary Examiner* — Derris Banks
*Assistant Examiner* — Tai Nguyen
(74) *Attorney, Agent, or Firm* — Oliff & Berridge, PLC (57) ABSTRACT

The invention aims to provide substrate treatment equipment that can automatically collect a substrate in a normal condition without needing manual operation. The equipment includes a substrate holder for holding substrates in a multi-stage manner and a substrate transfer unit for transferring the substrates into the substrate holder, wherein a substrate holding condition of the substrate holder is sensed by a sensing section. The sensing section has photo-sensors, and sensing waveforms sensed by the photo-sensors are compared with a normal waveform. A control section is provided, which controls a substrate transfer unit such that substrates other than at least a substrate that was determined to be abnormal are transferred by the unit.

4 Claims, 8 Drawing Sheets

U.S. PATENT DOCUMENTS 6,729,041 B2    5/2004    Shindo et al.
6,874,515 B2 *    4/2005    Ishihara et al. ............... 134/140

FOREIGN PATENT DOCUMENTS

| | | |
|---|---|---|
| JP | A-6-236910 | 8/1994 |
| JP | A-11-54593 | 2/1999 |

OTHER PUBLICATIONS

Office Action mailed Dec. 8, 2009 in U.S. Appl. No. 10/570,156.
Office Action mailed Sep. 13, 2010 in U.S. Appl. No. 12/081,200.
Office Action mailed Feb. 11, 2011 in U.S. Appl. No. 12/081,200.

* cited by examiner

A. DROP/IN PAIRS
B. DROP/LIGHT-EMITTING SIDE DROP
C. DROP/LIGHT-RECEIVING SIDE DROP
F. CRACKING/CENTER CRACKING
J. NORMAL SUBSTRATE CONDITION

FRONT VIEW OF BOAT (d)

NORMAL CONDITION
D. DROP/REAR DROP
E. DROP/FRONT DROP
G. CRACKING/FRONT CRACKING
H. CRACKING/REAR CRACKING
NORMAL CONDITION

METHOD OF MANUFACTURING A SEMICONDUCTOR DEVICE

CROSS-REFERENCE TO RELATED APPLICATIONS

This is a Continuation Application of Ser. No. 12/081,200 filed Apr. 11, 2008, which is a Divisional of application Ser. No. 10/570,156 filed Mar. 27, 2006, which in turn is a National Phase Application of PCT/JP2004/013791 filed Sep. 22, 2004. This application claims the benefit of Japanese Patent Application No. JP 2003-333664 filed Sep. 25, 2003. The entire disclosures of the prior applications are hereby incorporated by reference herein in their entirety.

BACKGROUND

The invention relates to substrate treatment equipment for treating a substrate of a semiconductor device or the like, and a manufacturing method of the substrate.

As is generally known, there is equipment as this type of substrate treatment equipment, which has a substrate holder for holding substrates in a multistage manner and a transfer unit for transferring the substrates into the substrate holder, and treats the substrates in a treatment furnace while holding a number of substrates in the substrate holder.

SUMMARY

When the substrates are heated in the treatment furnace, or removed from the treatment furnace and then cooled, abnormal phenomena such as cracks or warps may occur in the substrates due to thermal stress. When the cracks or warps are in such a level that they result in disabling automatic carrying of the substrates by an automatic substrate carrying mechanism, tweezers for taking in and out the substrates may collide with the substrates, and push down the substrate holder, leading to a serious accident such as damage of a quartz component.

To solve this, a mechanism for sensing a condition of the substrates can be considered to be provided. For example, the sensing mechanism has a photo-sensor provided on the transfer unit, and senses the substrates in the substrate holder by moving the photo-sensor using a vertical shaft of the transfer unit.

Portions where light is intercepted by the substrates and portions where light is transmitted between the substrates are recorded, and a shift level of the vertical shaft and sensing data of the photo-sensor are used to find whether a substrate pitch is normal with respect to a pitch of the substrate holder which has been known.

When a substrate drops from a support slot on the support holder due to cracking of the substrate or transfer errors, discrepancy may occur between interception/transmission data of light by the photo-sensor and the recorded data, and a substrate on a support slot at which the discrepancy appeared is determined to be in an abnormal transfer condition.

Moreover, when the substrate completely drops from a support slot and consequently the substrate does not lie on the support slot on which the substrate is essentially to be held, since light is not intercepted, the substrate can be sensed as a lost substrate.

After a substrate condition is sensed by the substrate sensing mechanism, a substrate that has been transferred onto the support slot at which an error occurred is manually collected by an operator who has entered the equipment.

Furthermore, after the substrate has been visually confirmed to be safe, it is automatically transferred by the automatic substrate carrying mechanism.

Currently, it is an issue to realize a mini-environment by using an L/L device (load/lock device), a $N_2$ purge device, and an organic filter and the like in order to avoid entering of moisture or particles contained in the air and thus reduce contamination of the substrate in substrate treatment equipment. When an abnormal substrate is manually collected after an abnormal phenomenon is sensed by the substrate condition sensing mechanism as describe above, particles generated from a human body may have adverse effects on a substrate in a normal condition at high possibility. In substrate treatment equipment using the $N_2$ purge device, an atmosphere within the equipment must be returned to the air to reset the environment such that the operator can enter the equipment. In such a situation, a natural oxidation film on a surface of the substrate can not be reduced, consequently a substrate that has been normally transferred also has a problem in process.

An object of the invention is to provide substrate treatment equipment that can automatically collect a substrate in a normal condition without needing manual operation.

To solve the problem, a first feature of the invention is substrate treatment equipment having a substrate treatment chamber, a substrate holder that can be inserted into the substrate treatment chamber and holds substrates in a multistage manner in a substantially vertical direction, a substrate transfer unit for transferring the substrates onto the substrate holder, and a sensing device for sensing a holding condition of the substrate held in the substrate holder; which includes a control device that, in transfer of the substrates, senses the holding condition of the substrates using the sensing device, and controls the substrate transfer unit such that substrates other than a substrate which was determined to be in an abnormal substrate holding condition are transferred by the substrate transfer unit.

A second feature of the invention is substrate treatment equipment having a substrate treatment chamber, a substrate holder that can be inserted into the substrate treatment chamber and holds substrates in a multistage manner in a substantially vertical direction, a substrate transfer unit for transferring the substrates onto the substrate holder, and a sensing device for sensing a holding condition of the substrate held in the substrate holder; which includes a control device that, in transfer of the substrates, senses the holding condition of the substrates using the sensing device, and controls the substrate transfer unit such that substrates other than a substrate which was determined to be in an abnormal substrate holding condition are transferred by the substrate transfer unit; wherein the control device controls the substrate transfer unit such that substrates other than the substrate determined to be abnormal and at least one of substrates held on and under the substrate determined to be abnormal are transferred by the substrate transfer unit.

A third feature of the invention is a manufacturing method of a substrate having a step of inserting a substrate holder in which substrates are held in a multistage manner in a substantially vertical direction into a substrate treatment chamber, a step of performing heat treatment to the substrates in the substrate treatment chamber, a step of sensing a holding condition of the substrates held in the substrate holder, and a step of transferring substrates other than a substrate that was determined to be in an abnormal substrate holding condition by a substrate transfer unit.

A fourth feature of the invention is a manufacturing method of a substrate having a step of inserting a substrate holder in which substrates are held in a multistage manner in a substantially vertical direction into a substrate treatment chamber, a step of performing heat treatment to the substrates in the substrate treatment chamber, a step of sensing a holding condition of the substrates held in the substrate holder, and a step of transferring substrates other than a substrate that was determined to be in an abnormal substrate holding condition by a substrate transfer unit; wherein the substrates are transferred in such a manner that substrates are carried for each of several predetermined number of substrates, and when all the predetermined number of substrates to be carried are determined to be in a normal substrate holding condition, all the predetermined number of substrates are carried together, and when at least one of the substrates is determined to be in an abnormal substrate holding condition, substrates other than the substrate that was determined to be abnormal in the predetermined number of substrates are carried one at a time.

While control means may control the transfer unit such that all the substrates other than the substrate that was determined to be abnormal are transferred by the transfer unit, it preferably controls the transfer unit such that substrates other than the substrate that was determined to be abnormal and at least one of substrates on and under the substrate are transferred by the transfer unit.

According to the substrate treatment equipment of the invention, in transfer of substrates, the holding condition of the substrates is sensed, and the transfer unit is controlled such that substrates other than at least a substrate that was determined to be abnormal are transferred by the transfer unit, therefore substrates in a normal condition can be automatically collected, and entering of particles into the equipment or oxidation on the substrates can be prevented.

DETAILED DESCRIPTION OF EMBODIMENTS

Next, an embodiment of the invention is described according to drawings.

Figure 1:
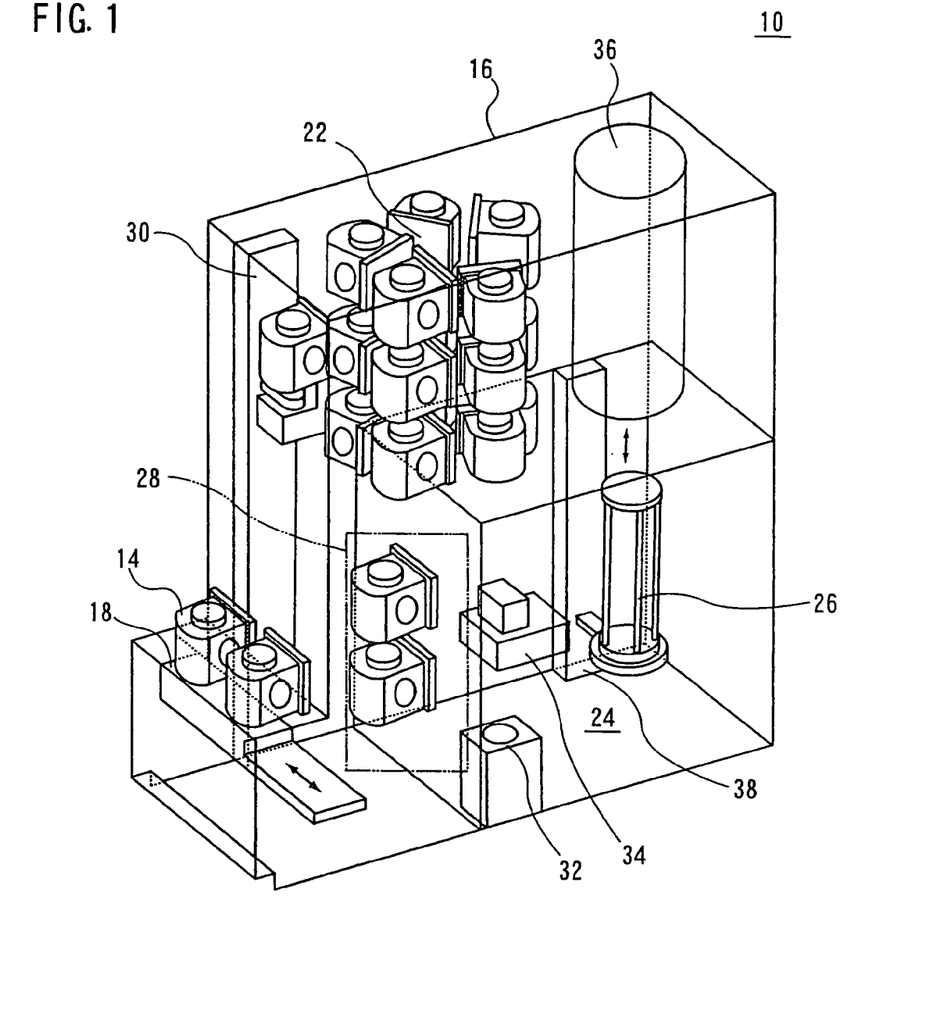
FIG. 1 is a perspective view generally showing substrate treatment equipment according to an embodiment of the invention.
Figure 2:
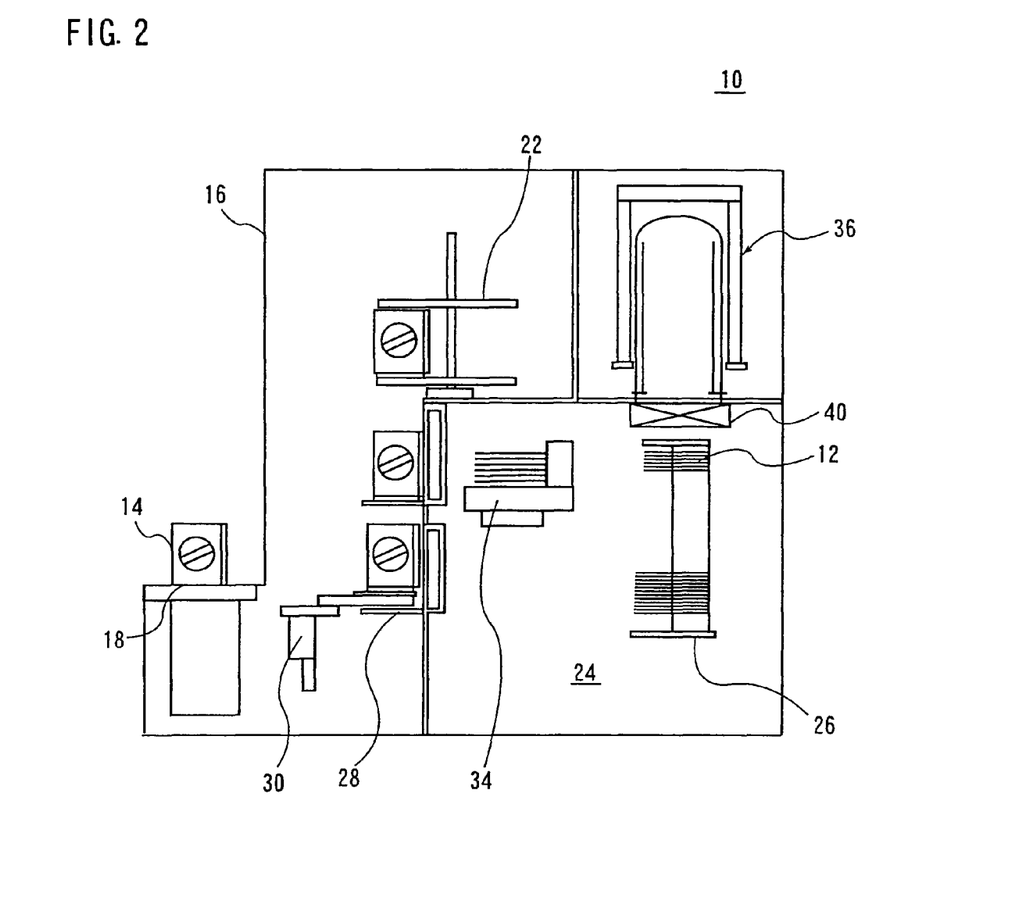
FIG. 2 is a cross section view generally showing the substrate treatment equipment according to the embodiment of the invention.

FIG. 1 and FIG. 2 show substrate treatment equipment 10 according to the embodiment of the invention. The substrate treatment equipment 10 is vertical-type one for performing diffusion treatment or CVD treatment to a substrate. In the substrate treatment equipment 10, a load/unload stage 18 for inserting a pod 14 accommodating substrates 12 formed from silicon and the like from the outside into a housing 16 is fixed on a front face of the housing 16. A cassette shelf 22 for storing the inserted pod 14 is provided within the housing 16. Moreover, an $N_2$ purge chamber 24 is provided within the housing 16. The $N_2$ purge chamber 24 acts as a carrying area of the substrates 12, or a space for carrying in and out a substrate holder (boat) 26. When treatment of the substrate 12 is performed, the $N_2$ purge chamber 24 is filled with inert gas such as $N_2$ gas to prevent a natural oxidation film from being formed on the substrate 12.

FOUP is used for the pod 14, and the substrate 12 can be carried while being isolated from the air by covering an opening provided in a side face of the pod 14 by a cap (not shown), and the substrate 12 can be taken in and out into/from the pod 14 by removing the cap. For example, 25 substrates 12 are stored in the pod 14. A pod opener 28 is provided in a front face of the $N_2$ purge chamber 24 so that the cap of the pod 14 is removed to communicate the atmosphere within the pod 14 with the atmosphere within the $N_2$ purge chamber 24. The pod 14 is carried among the pod opener 28, cassette shelf 22 and load/unload stage 18 by the cassette transfer unit 30. Air cleaned by a clean unit (not shown) provided on the housing 16 is flowed through a space for carrying the pod 14 by the cassette transfer unit 30.

Within the $N_2$ purge chamber 24, a substrate holder 26 for loading a plurality of substrates 12 in a multistage manner, a substrate alignment device 32 for aligning a notch (or an orientation flat) of the substrate 12 to an optional position, and a substrate transfer unit 34 for carrying the substrate 12 between the pod 14 on the pod opener 28 and the substrate alignment device 32 are provided. A treatment furnace 36 for treating the substrates 12 is provided in an upper part of the $N_2$ purge chamber 24, and the substrate holder 26 is loaded into the treatment furnace 36 by a boat elevator 38 as elevating means, or unloaded from the treatment furnace 36 by it. The treatment furnace 36 has a furnace port which is closed by a furnace port shutter 40 during except for a period during treating the substrate 12.

Next, operation of the substrate processing equipment 10 according to the embodiment is described.

First, the pod 14 carried from the outside of the housing 16 by AGV or OHT is set on the load/unload stage 18. The pod 14 set on the load/unload stage 18 is directly carried onto the pod opener 28, or stocked temporarily on the cassette shelf 22 and then carried onto the pod opener 28 by the cassette transfer unit 30. When the pod 14 is carried onto the pod opener 28, the cap of the pod 14 is removed by the pod opener 28, and thereby the atmosphere within the pod 14 is communicated with the atmosphere within the $N_2$ purge chamber 24.

Then, a substrate 12 is removed from the pod 14 in a condition of being communicated with the atmosphere within the $N_2$ purge chamber 24 by the substrate transfer unit 34. The removed substrate 12 is aligned by the substrate alignment device 32 such that the notch or the orientation flat is fixed in an optional position, and after that carried onto the substrate holder 26.

When the substrates 12 have been carried into the substrate holder 26, the furnace port shutter 40 of the treatment furnace 36 is opened, and then the substrate holder 26 having the substrates 12 mounted therein is loaded into the treatment furnace 36 by the boat elevator 38.

After loading, predetermined treatment is performed to the substrates 12 in the treatment furnace 36, and after the treatment, the substrates 12 and the pod 14 are ejected to the outside of the housing 16 in the reverse order of the above procedure.

Figure 3:
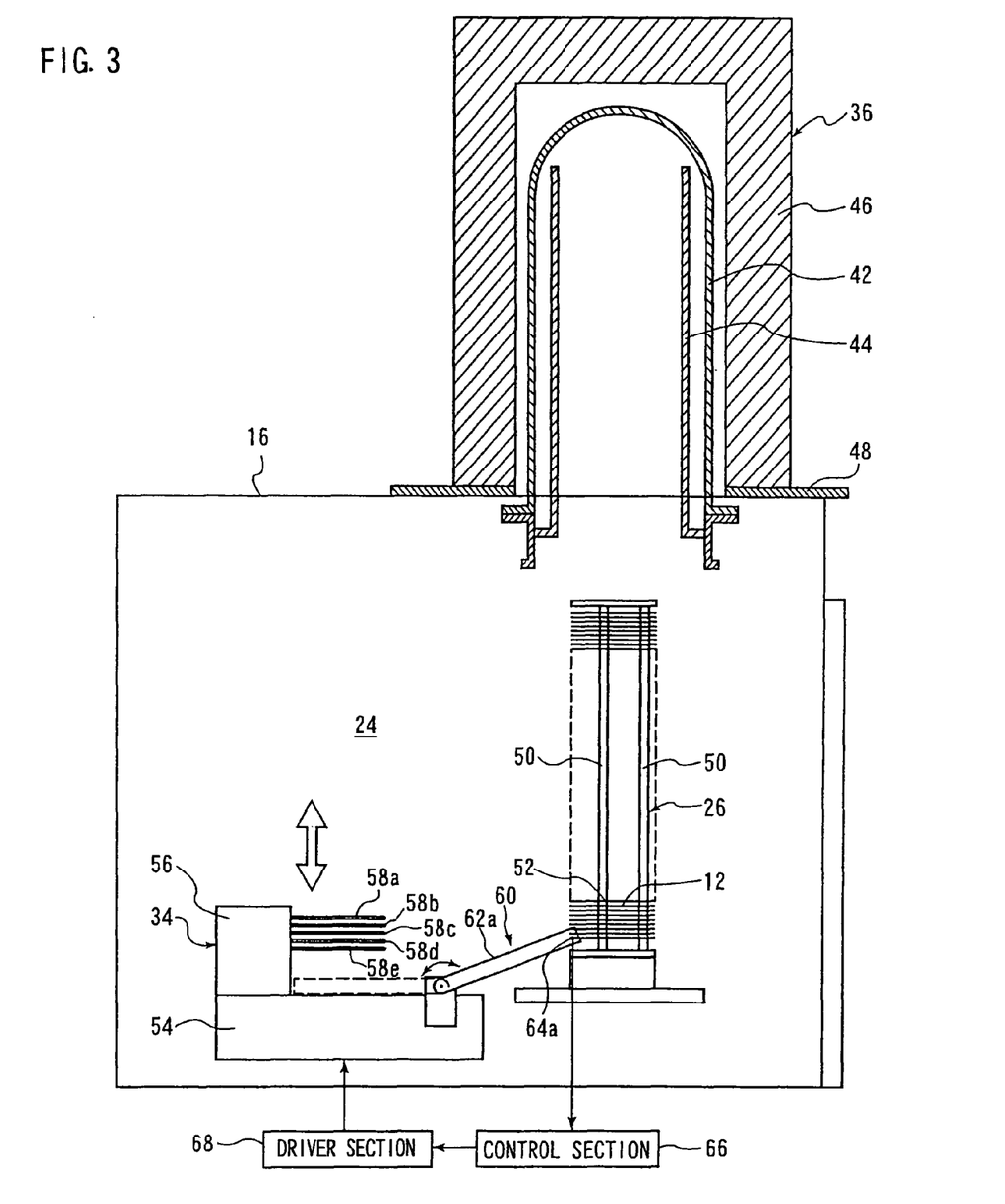
FIG. 3 is a cross section view showing a treatment furnace used in the substrate treatment equipment according to the embodiment of the invention and the periphery of the furnace.

FIG. 3 shows a peripheral configuration of the treatment furnace 36. The treatment furnace 36 has an outer tube 42 formed from a heat resistant material such as quartz ($SiO_2$). The outer tube 42 is in a cylindrical shape that is closed at an upper end and has an opening at a lower end. An inner tube 44 is disposed concentrically within the outer tube 42. A heater 46 as heating means is disposed concentrically on the outer circumference of the outer tube 42. The heater 46 is held on the housing 16 via a heater base 48.

Figure 4:
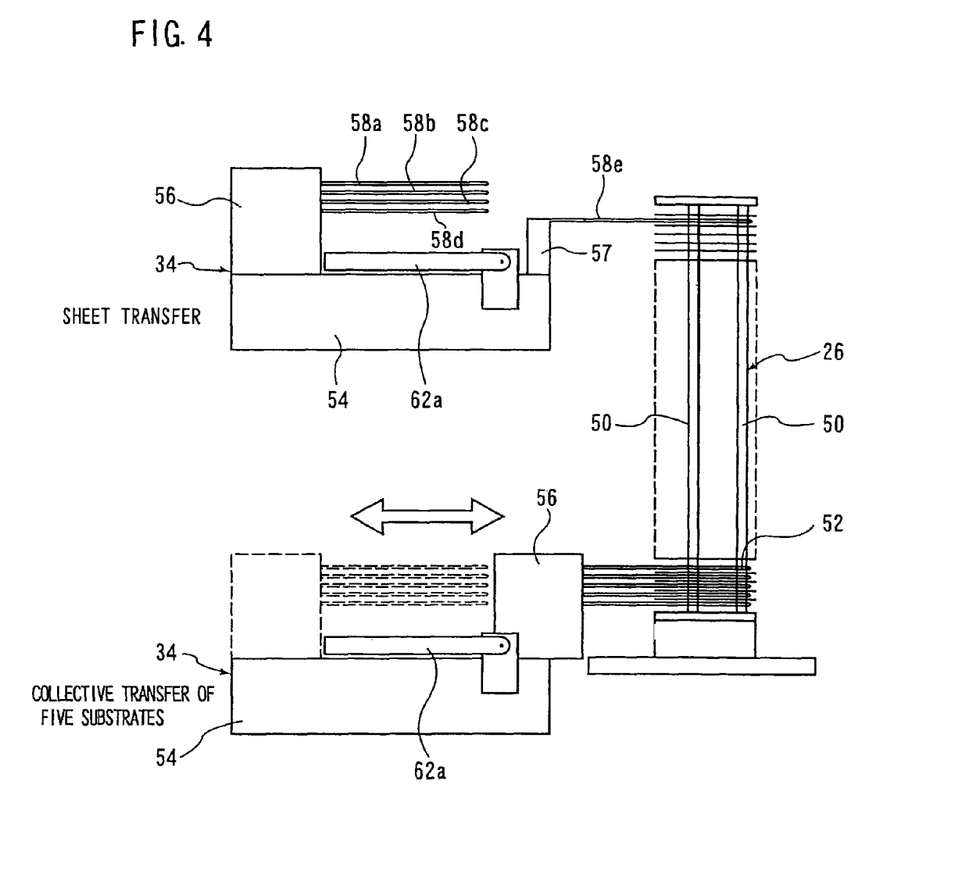
FIG. 4 is a side view showing a substrate transfer unit used in the substrate treatment equipment according to the embodiment of the invention.
Figure 5:
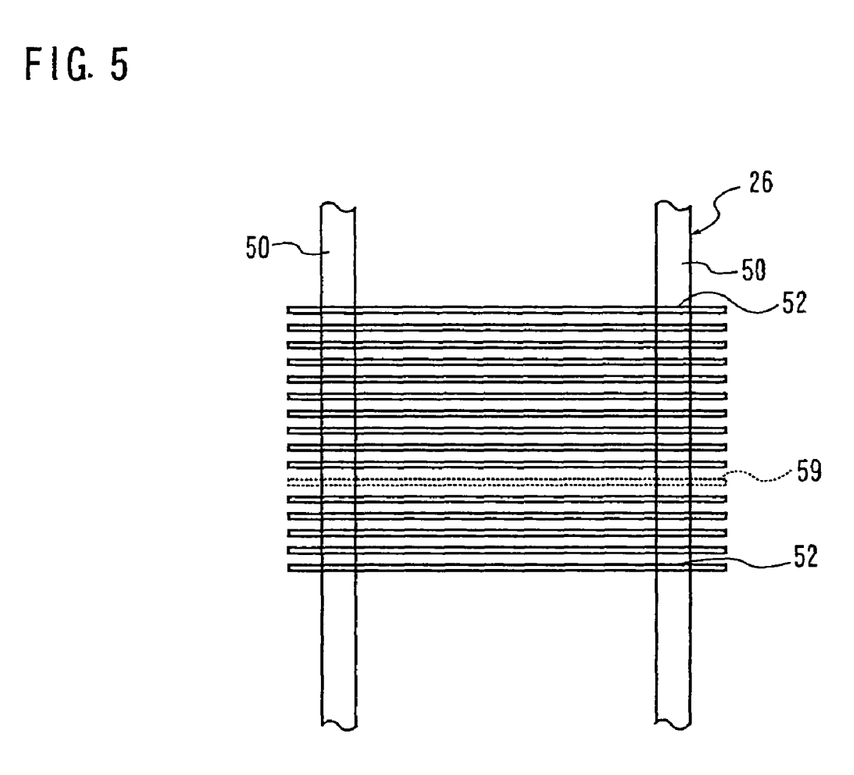
FIG. 5 is a side view showing a substrate holder used in the substrate treatment equipment according to the embodiment of the invention.

As shown in FIG. 4 and FIG. 5, in the substrate holder 26, for example, three poles 50 formed from, quartz, silicon carbide and the like are disposed parallel in a vertical direction, and the substrates 12 are held by support slots 52 formed on the poles 50. The substrate transfer unit 34 has a transfer unit body 54 that moves vertically and rotates, and a main tweezers body 56 that moves reciprocally on the transfer unit body 54. For example, four tweezers 58a, 58b, 58c and 58d are fixed to the main tweezers body 56 in a manner of extending parallel to one another. Moreover, sub tweezers body 57 is provided on the transfer unit body 54 such that it can reciprocally move either along with or independently of the main tweezers body 56. Tweezers 58e are fixed to the sub tweezers body 57 at a position below the four tweezers 58a to 58d and parallel to them. Therefore, as shown in FIG. 4, the substrate transfer unit 34 can collectively transfer five substrates 12 using the five tweezers 58a to 58e, and can transfer one monitor substrate (sheet transfer) using the tweezers 58e at the lowermost stage. When the monitor substrate is transferred, as shown in FIG. 5, a space corresponding to one slot is opened between sets of collectively transferred, five substrates 12, and a monitor substrate 59 is extracted from a pod different from a pod for typical substrates 12, and inserted between the sets of the five substrates.

For example, 25 substrates 12 are accommodated in the pod 14, and in the case that the substrates 12 are transferred into or collected from the substrate holder 26 by the substrate transfer unit 34, when there is no abnormal substrate in five slots (slot group), five substrates 12 are collectively transferred or collected using the five tweezers 58a to 58e, and when there is an abnormal substrate in the slot group, only normal substrates are collected using the tweezers 58e at the lowermost stage. The monitor substrate may be collected one at a time as in insertion.

A sensing section 60 as sensing means is provided on the transfer unit body 54. The sensing section 60 has parallel, two arms 62a, 62b, and is provided such that the arms 62a, 62b can be turned on a side face of the transfer body 54. Near front ends of the arms 62a, 62b, transmission-type photo-sensors 64a, 64b are provided, and one of the photo-sensors is a light emitting element, and the other is a light receiving element. When a holding condition of the substrates 12 transferred into the substrate holder 26 is sensed, the arms 62a, 62b are turned and fixed to a side of the substrate holder 26 so that light axes of the photo-sensors 64a, 64b run through the substrates 12, and then sensing output of the photo-sensors 64a, 64b is monitored while the substrate transfer unit 34 is moved from a lower end to an upper end of the substrate holder 26. On the other hand, when the substrates 12 are transferred into the substrate holder 26 by the substrate transfer unit 34, the arms 62a, 62b are turned to a side opposite to the substrate holder side to prevent the arms 62a, 62b from being interfered with the substrates 12 or the substrate holder 26.

As shown in FIG. 3, analog signals outputted from the photo-sensors 64a, 64b are outputted to a control section 66 including a computer. The control section 66 controls the substrate transfer unit 34 via a driver section 68 such as a motor.

Next, sensing of the abnormal condition of the substrates 12 is described.

Figure 6:
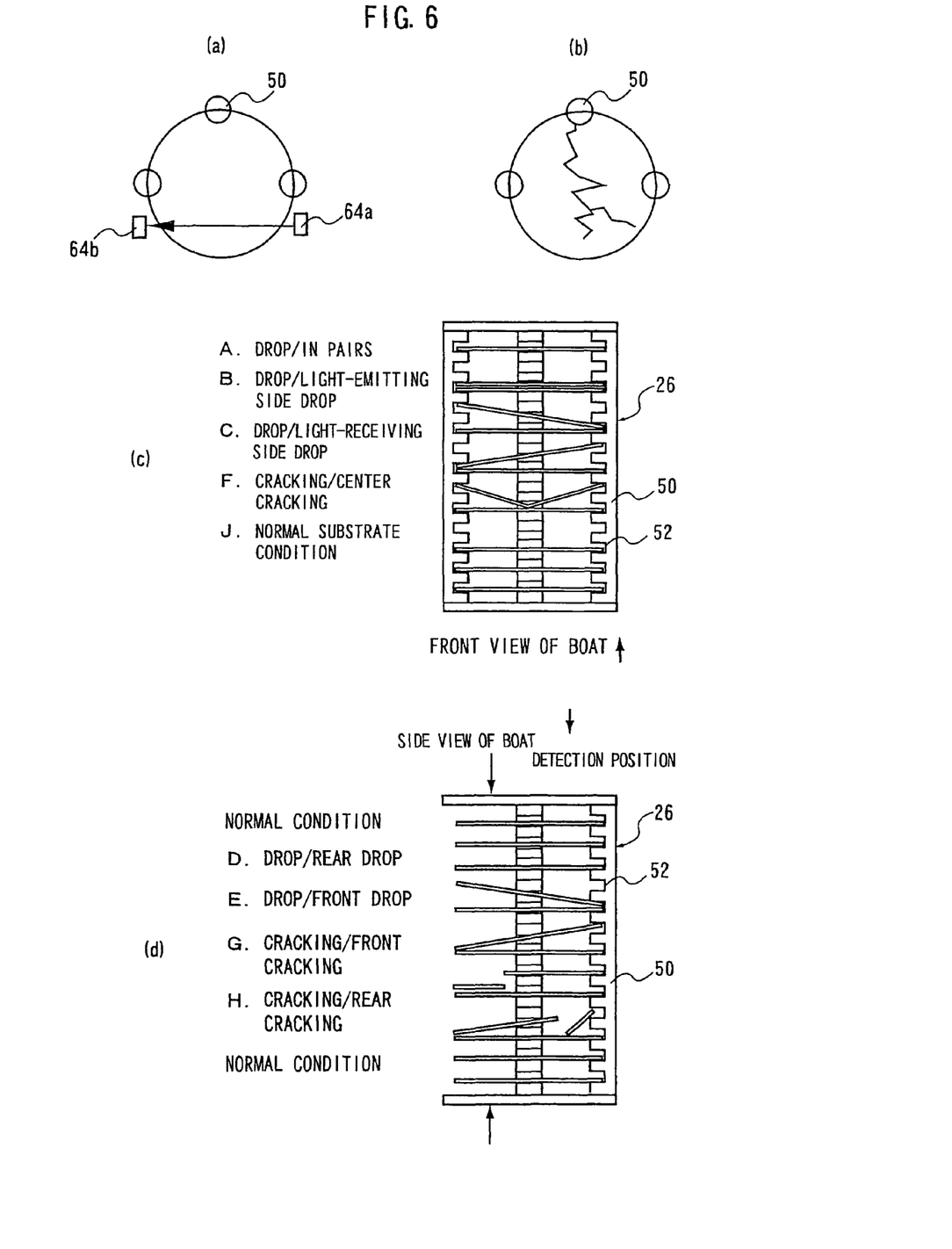
FIG. 6 is views for illustrating an abnormal condition of substrate holding in the substrate treatment equipment according to the embodiment of the invention, wherein (a) is a plane view showing a normal condition, (b) is a front view showing a condition of cracking in a substrate, (c) is a front view showing the substrate holder, and (d) is a side view of the substrate holder.

As shown in FIG. 6(a), it is assumed that the light emitting element 64a is situated at the right side, and the light receiving element 64b is situated at the left side in a view from a top of the substrate holder 26, and the light emitting element 64a and the light receiving element 64b are disposed at a front face side of the substrate holder 26. As shown in FIG. 6(b), the substrate 12 may crack while being held in the substrate holder 26 or drop from the support slot 52 of the substrate holder 26, resulting in falling into abnormal condition. As shown in FIG. 6(c) and FIG. 6(d), the abnormal conditions of the substrate 12 are given as follows.

A. drop/in pairs
B. drop/light-emitting side drop (left face drop)
C. drop/light-receiving side drop (right face drop)
D. drop/rear drop (back face drop)
E. drop/front drop (front face drop)
F. cracking/center cracking
G. cracking/front cracking
H. cracking/rear cracking
J. no substrate A substrate 12, which is in the normal condition, is supported parallel to a support slot 52.

Figure 7:
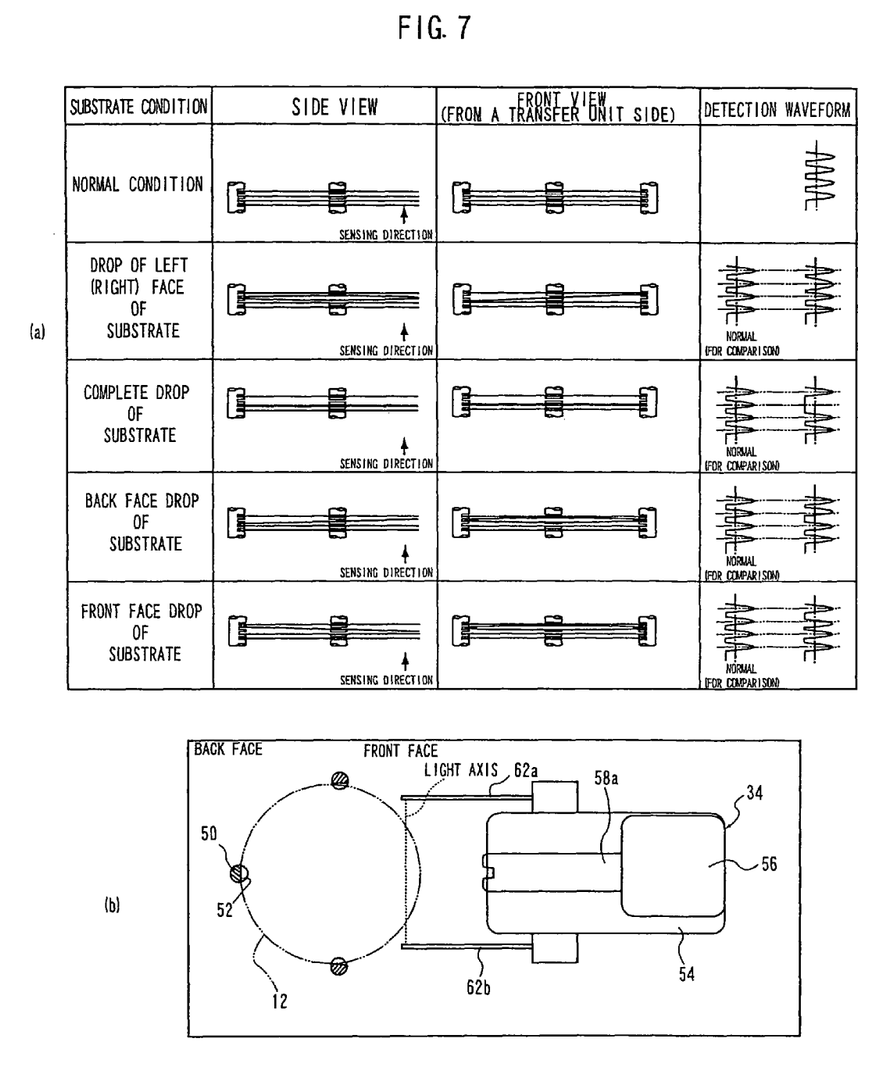
FIG. 7 is views for illustrating a sensing method when an abnormal condition of substrate holding is found in the substrate treatment equipment according to the embodiment of the invention, wherein (a) is an illustrative view showing a relation between the abnormal condition of substrate holding and a sensing waveform, and (b) is a plane view of the substrate transfer unit.

FIG. 7(a) shows a relation of signal output from the photo-sensors 64a, 64b to the abnormal condition. A positional relation between the substrate holder 26 and the photo-sensors 64a, 64b is assumed that the photo-sensors 64a, 64b are at a front side, and a side opposed to the photo-sensors is a back side as shown in FIG. 7(b).

When the holding condition of the substrates 12 is normal, waveforms outputted from the photo-sensors 64a, 64b are regular. For example, when a left or right surface of the substrate 12 drops, sensing waveforms of the photo-sensors 64a, 64b are gradually spread at left and right of a peak compared with a normal waveform, consequently width at a reference line is increased. When the substrate 12 completely drops from the support slot 52, sensing output of the photo-sensors 64a, 64b disappears at that support slot 52 from which the substrate has dropped. When the substrate 12 drops from the support slot 52 at the back, the peak is shifted to the upper side compared with the normal waveform. When the substrate 12 drops from the support slot 52 at the front, the peak is shifted to the lower side compared with the normal waveform. The case that the substrate 12 has cracked can be also sensed.

Figure 8:
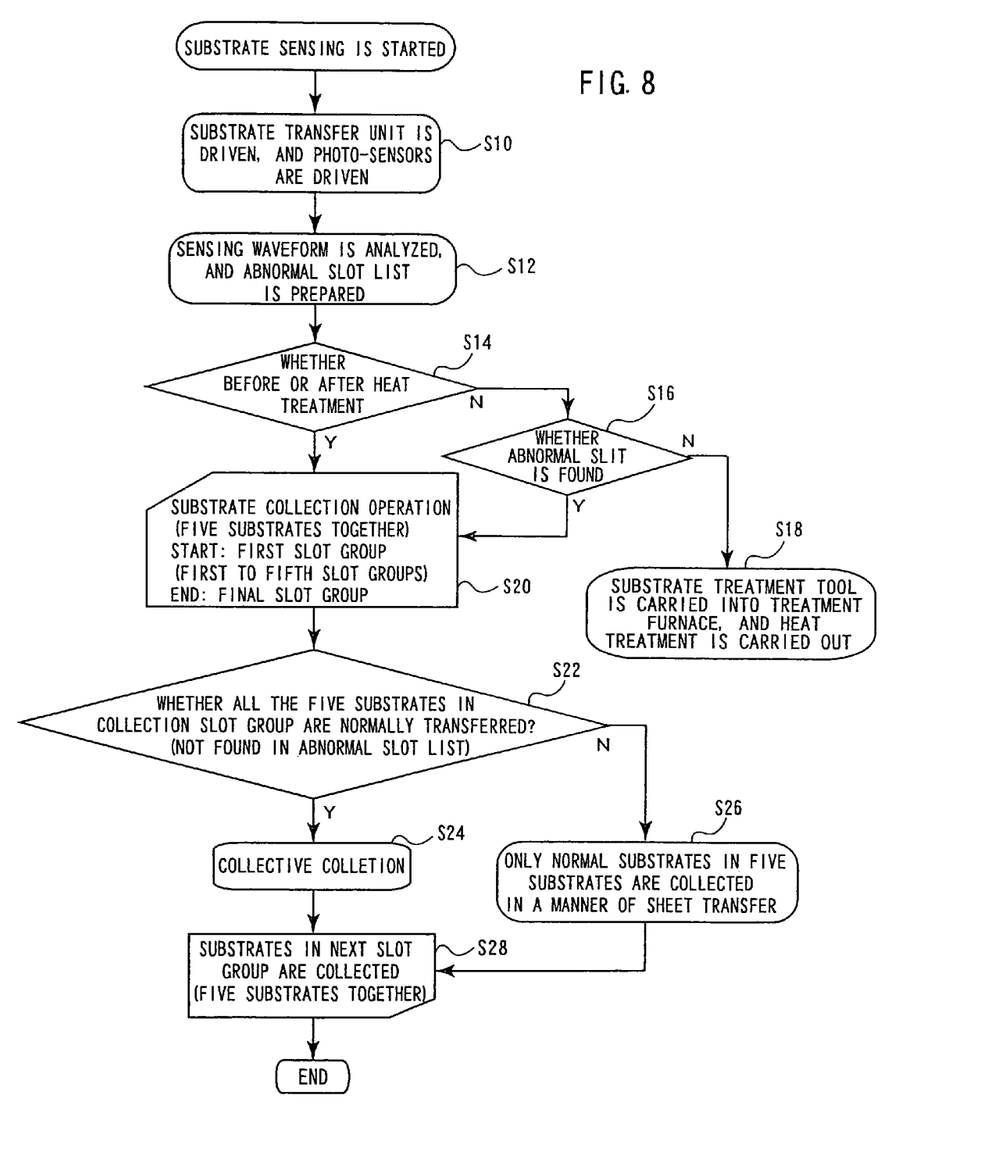
FIG. 8 is a flowchart showing operation of substrate sensing in the substrate treatment equipment according to the embodiment of the invention.

FIG. 8 shows an example of substrate sensing operation by the control section in a flowchart.

First, in step S10, drive of the substrate transfer unit and the photo-sensors is started. That is, as previously shown in FIG. 3, the arms 62a, 62b are rotationally fixed to the side of the substrate holder 26, and then a transfer condition of the substrates 12 is sensed by the photo-sensors 64a, 64b while the substrate transfer unit 34 is raised from the lowermost end of the substrate holder 26 at a constant speed. The quantity of light of light emitting/receiving of the photo-sensors 64a, 64b is inputted into the control section 66 as analog signals.

In next step S12, the analog signals inputted from the photo-sensors 64a, 64b are converted into digital signals to analyze detection output from the photo-sensors 64a, 64b. In this analysis of output from the photo-sensors 64a, 64b, the sensing waveforms from the photo-sensors 64a, 64b are recorded and then compared with the normal waveform so that an abnormal slot is specified and thus an abnormal slot list is prepared.

In next step S14, whether before or after heat treatment is determined. When determination is made as before heat treatment, the operation is advanced to step 16 to determine whether an abnormal slot is found or not, and when it is determined that the abnormal slot is not found, the operation is advanced to step S18 in which the substrate supporter 26 is carried into the treatment furnace 36, and then heat treatment is carried out. On the other hand, when determination is made as after heat treatment in the step S14, or when it is determined in the step S16 that the abnormal slot is found, the operation is advanced to step S20 in which collection of the substrates 12 is started. As described before, the collection of the substrates 12 is performed for each of slot groups, and it is begun at a first slot group and ended at a fifth slot group that is a final slot group. In next step S22, whether all the five substrates in the slot group to be collected are transferred in the normal condition (not found in the abnormal slot list) is determined. When all the five substrates are determined to be in the normal condition in the step S22, the operation is advanced to step S24 in which all the five substrates are collected together. On the other hand, when it is determined that there is a substrate in the abnormal condition in the five substrates 12 in an objective slot group (found in the abnormal slot list) in the step S22, the operation is advanced to step S26 in which only the substrates in the normal condition are collected in a manner of sheet transfer. When collection is not completed for all the slot groups in the step S28, the operation is returned to processing for a next slot group, and when collection is completed for all the slot groups, the operation is finished.

In the embodiment, when a substrate in the abnormal condition is found, the substrate in the abnormal condition is remained in the substrate holder, and all the substrates in the normal condition are returned into the pod, however, the invention is not necessarily limited to this. When the substrate in the abnormal condition is found, a substrate on or under the substrate may receive a kind of damage. Thus, it is also acceptable that at least one of substrates on and under the substrate in the abnormal condition is also remained in the substrate holder, and other substrates in the normal condition are returned into the pod.

INDUSTRIAL APPLICABILITY

The invention can be used for substrate treatment equipment that automatically collects substrates.

What is claimed is:

1. A manufacturing method of a semiconductor device, comprising:
    inserting a substrate holder on which substrates are held in a multistage manner in a substantially vertical direction into a substrate treatment chamber,
    performing heat treatment to the substrates in the substrate treatment chamber,
    sensing a holding condition of the substrates held in the substrate holder, and
    transferring substrates other than a substrate determined to be abnormal and at least one of the substrates contacting the substrate determined to be abnormal in the substrate holder by a substrate transfer unit.

2. A transferring method of a substrate comprising:
    inserting a substrate holder on which substrates are held in a multistage manner in a substantially vertical direction into a substrate treatment chamber,
    performing heat treatment to the substrates in the substrate treatment chamber,
    sensing a holding condition of the substrates held in the substrate holder, and
    transferring substrates other than a substrate determined to be abnormal and at least one of the substrates contacting the substrate determined to be abnormal in the substrate holder by a substrate transfer unit.

3. A manufacturing method of a semiconductor device according to claim 1, wherein the transferring substrates occurs after the sensing the holding condition of the substrates.

4. A transferring method of a substrate according to claim 2, wherein the transferring substrates occurs after the sensing the holding condition of the substrates.

* * * * *